(12) United States Patent
Kasai

(10) Patent No.: US 7,678,596 B2
(45) Date of Patent: Mar. 16, 2010

(54) METHOD FOR MANUFACTURING MONOLITHIC SEMICONDUCTOR LASER

(75) Inventor: Nobuyuki Kasai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/039,914

(22) Filed: Feb. 29, 2008

(65) Prior Publication Data

US 2009/0093076 A1    Apr. 9, 2009

(30) Foreign Application Priority Data

Oct. 9, 2007   (JP) .............................. 2007-263573

(51) Int. Cl.
*H01L 33/00* (2006.01)
(52) U.S. Cl. ............................. 438/34; 438/35; 438/46; 438/47; 372/50.12; 372/50.121; 257/E33.032
(58) Field of Classification Search .................. 438/22, 438/34, 35, 28, 31, 39, 46, 47; 372/43.01, 372/50.12, 50.121; 257/E33.031, E33.032
See application file for complete search history.

(56) References Cited

U.S. PATENT DOCUMENTS 6,266,354 B1 *  7/2001  Chino et al. ............. 372/43.01

2001/0017873 A1 *  8/2001  Imafuji et al. ................. 372/43
2005/0069005 A1     3/2005  Nishida et al.
2005/0271108 A1 * 12/2005  Wada et al. .............. 372/50.12

FOREIGN PATENT DOCUMENTS

JP    2000-244073    9/2000
JP    2005-109102    4/2005

* cited by examiner

*Primary Examiner*—Matthew C Landau
*Assistant Examiner*—Lindsay Wickers
(74) *Attorney, Agent, or Firm*—Leydig, Voit & Mayer, Ltd.

(57) ABSTRACT

First and second semiconductor lasers interelement-separated from each other are formed. Total thickness of a fourth upper cladding layer and a second contact layer of the second semiconductor laser is smaller than total thickness of a second upper cladding layer and the first contact layer of the first semiconductor laser. First and second ridges are formed in the first and second semiconductor lasers by dry etching, using a resist as a mask, and the dry etching is stopped when a second etching stopper layer is exposed at the second ridge. The second upper cladding layer remaining on a first etching stopper layer at the first ridge is selectively removed by wet etching, using the resist as a mask.

2 Claims, 10 Drawing Sheets

METHOD FOR MANUFACTURING MONOLITHIC SEMICONDUCTOR LASER

BACKGROUND OF THE INVENTION

1. Field of the Invention

The present invention relates to a method for manufacturing a monolithic semiconductor laser that can suppress fluctuation in laser properties and can improve reliability.

2. Background Art

A monolithic semiconductor laser wherein both a semiconductor laser for CD and a semiconductor laser for DVD having different emission wavelengths are formed on the same substrate has been used (e.g., refer to Japanese Patent Laid-Open No. 2000-244073 and No. 2005-109102).

A method for manufacturing a conventional monolithic semiconductor laser will be described referring to the drawings. First, as shown in FIG. 24, a buffer layer 11, a first lower clad layer 12, a first active layer 13, a first upper clad layer 40, a second upper clad layer 41, and a first contact layer 17 are formed on a GaAs substrate 10. Thereafter, a photoresist 18 is applied onto the entire surface and patterned.

Next, the buffer layer 11, the first lower clad layer 12, the first active layer 13, the first upper clad layer 40, the second upper clad layer 41, and the first contact layer 17 are etched using the photoresist 18 as a mask. Thereafter, the photoresist 18 is removed. Thereby, a semiconductor laser for CD 19 is formed as shown in FIG. 25.

Next, a buffer layer 21, a second lower clad layer 22, a second active layer 23, a third upper clad layer 24, a second etching stopper layer 25, a fourth upper clad layer 26, and a second contact layer 27 are formed on the entire surface. Then, the buffer layer 21, the second lower clad layer 22, the second active layer 23, the third upper clad layer 24, the second etching stopper layer 25, the fourth upper clad layer 26, and the second contact layer 27 are etched using photoresist as a mask. Thereby, a semiconductor laser for DVD 29 interelement-separated from the semiconductor laser for CD 19 is formed as shown in FIG. 26.

Next, as shown in FIG. 27, a photoresist 31 is applied onto the entire surface and patterned. Then, as shown in FIG. 28, the first contact layer 17, the second upper clad layer 41, and the first upper clad layer 40 of the semiconductor laser for CD 19; and the second contact layer 27 and the fourth upper clad layer 26 of the semiconductor laser for DVD 29 are simultaneously subjected to dry etching using the photoresist 31 as a mask. Thereby, first and second ridges 32 and 33 are formed on the semiconductor laser for CD 19 and the semiconductor laser for DVD 29, respectively. Thereafter, the photoresist 31 is removed as shown in FIG. 29.

SUMMARY OF THE INVENTION

When the first and second ridges 32 and 33 are formed, the endpoint of dry etching is determined by detecting light emission form the second etching stopper layer 25 of the semiconductor laser for DVD 29. Therefore, in the semiconductor laser for DVD 29, the thickness of an epitaxial layer on the second active layer 23 can be controlled with a high degree of accuracy. On the other hand, the semiconductor laser for CD 19 has no etching stopper layers. Therefore, even if one tries to stop etching in the first upper clad layer 40, which normally becomes the endpoint of etching, due to the effect of etching of the semiconductor laser for DVD 29, the endpoint of dry etching of the semiconductor laser for CD 19 is fluctuated. Therefore, in the semiconductor laser for CD 19, the thickness of an epitaxial layer on the first active layer 13 could not be controlled with a high degree of accuracy. Thereby, there was a problem wherein laser properties were fluctuated and reliability was lowered.

Furthermore, in Japanese Patent Laid-Open No. 2000-244073, since block layers and contact layers are regrown after the ridges have been formed, the active layers are subjected to excessive thermal history. Thereby, there was a problem wherein laser properties were fluctuated and reliability was lowered.

To solve problems as described above, an object of the present invention is to provide a method for manufacturing a monolithic semiconductor laser that can suppress fluctuation in laser properties and can improve reliability.

According to one aspect of the present invention, a method for manufacturing a monolithic semiconductor laser comprises steps for: forming a first lower clad layer, a first active layer, a first upper clad layer, a first etching stopper layer, a second upper clad layer, and a first contact layer of a first semiconductor laser, on a semiconductor substrate; forming a second lower clad layer, a second active layer, a third upper clad layer, a second etching stopper layer, a fourth upper clad layer, and a second contact layer of a second semiconductor laser interelement-separated from said first semiconductor laser, on said semiconductor substrate so that a total thickness of said fourth upper clad layer and said second contact layer is smaller than a total thickness of said second upper clad layer and said first contact layer; applying a resist onto the entire surface and patterning said resist to form openings in said first and second semiconductor lasers; simultaneously forming first and second ridges on said second upper clad layer and said first contact layer, and said fourth upper clad layer and said second contact layer, respectively, by dry etching using said resist as a mask, and stopping the dry etching when said second etching stopper layer is exposed on the side of said second ridge; and selectively removing said second upper clad layer remaining on the first etching stopper layer on the side of said first ridge, by wet etching using said resist as a mask.

According to the present invention, the fluctuation in laser properties can be suppressed, and reliability can be improved.

Other and further objects, features and advantages of the invention will appear more fully from the following description.

DETAILED DESCRIPTION OF THE PREFERRED EMBODIMENTS

First Embodiment

Figure 1:
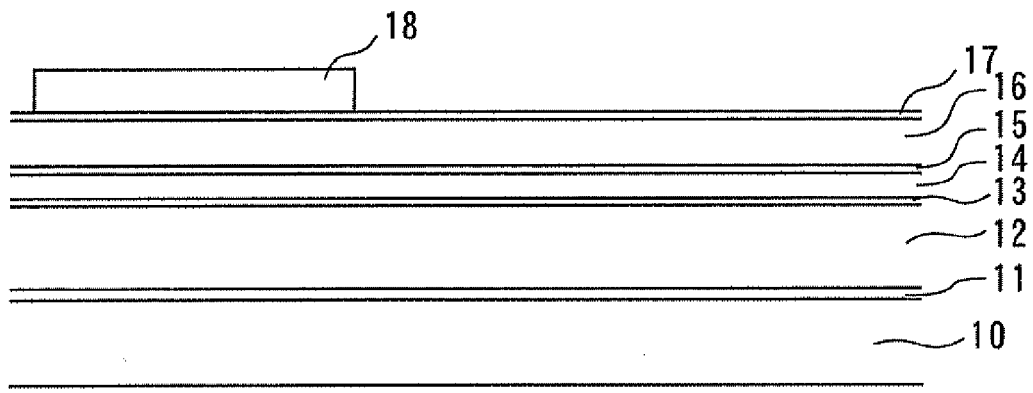
FIGS. 1-8 are sectional views for explaining a method of manufacturing a monolithic semiconductor laser according to First Embodiment of the present invention.

A method for manufacturing a monolithic semiconductor laser according to the first embodiment of the present invention will be described referring to the drawings. First, as shown in FIG. 1, a buffer layer 11 composed of AlGaAs or GaAs, a first lower clad layer 12 of a multilayer structure composed of AlGaInP or having a lower AlGaInP layer and an upper AlGaAs layer, a first active layer 13 having a multi-quantum well structure composed of AlGaAs or AlGaAs/GaAs, a first upper clad layer 14 composed of AlGaAs, a first etching stopper layer 15, a second upper clad layer 16 composed of AlGaInP, and a first contact layer 17 are sequentially formed on a GaAs substrate 10 (semiconductor substrate). Thereafter, a photoresist 18 is applied onto the entire surface and patterned.

Figure 2:
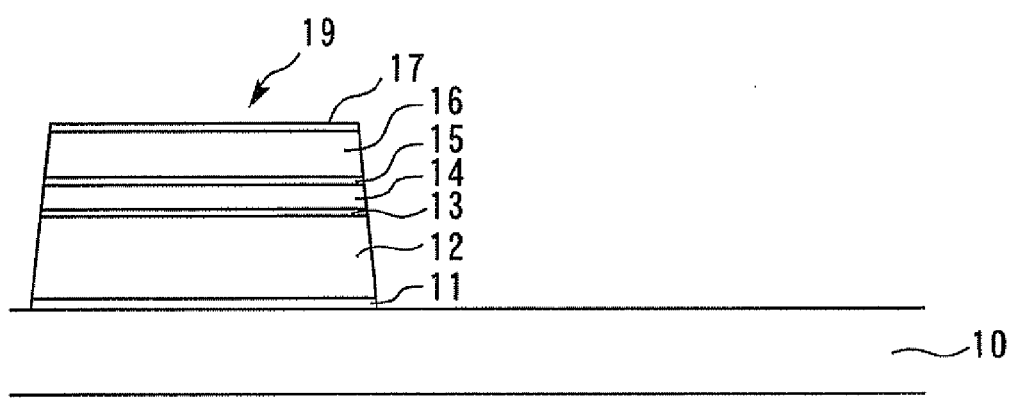

Next, by etching using the photoresist 18 as a mask, the buffer layer 11, the first lower clad layer 12, the first active layer 13, the first upper clad layer 14, the first etching stopper layer 15, the second upper clad layer 16, and the first contact layer 17 are removed from a region for forming a semiconductor laser for DVD (described later) and an interelement separating region. Thereafter, the photoresist 18 is removed. Thereby as shown in FIG. 2, a semiconductor laser for CD 19 (first semiconductor laser) is formed.

Figure 3:
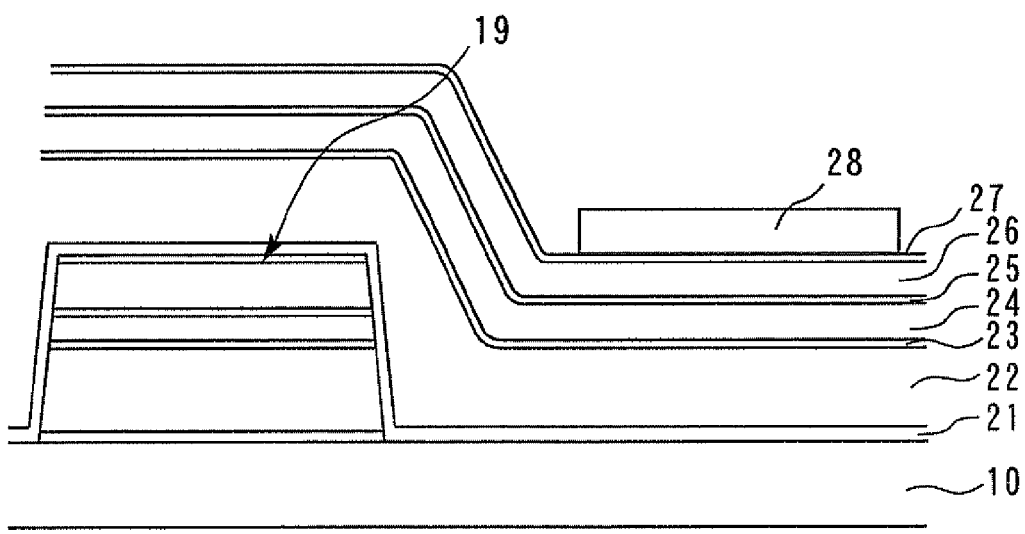

Next, as shown in FIG. 3, a buffer layer 21, a second lower clad layer 22 composed of AlGaInP, a second active layer 23, a third upper clad layer 24 composed of AlGaInP, a second etching stopper layer 25, a fourth upper clad layer 26 composed of AlGaInP, and a second contact layer 27 are sequentially formed on the GaAs substrate 10. Then, a photoresist 28 is applied onto the entire surface and patterned.

Figure 4:
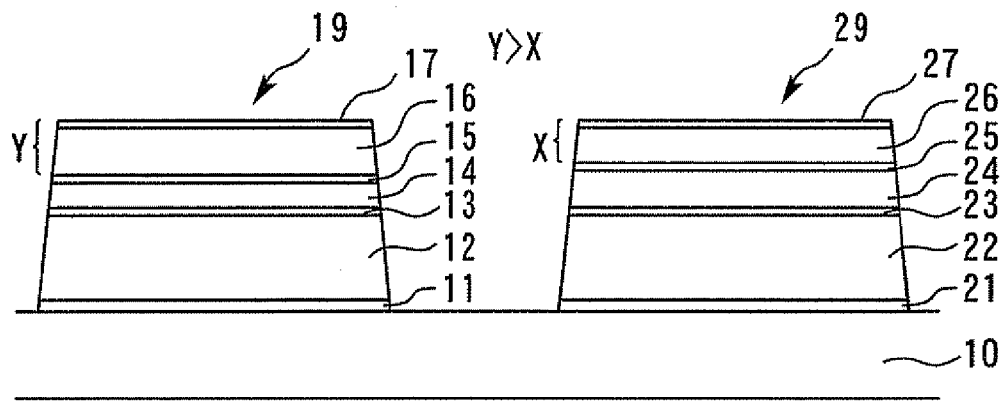

Next, by etching using the photoresist 28 as a mask, the buffer layer 21, the second lower clad layer 22, the second active layer 23, the third upper clad layer 24, the second etching stopper layer 25, the fourth upper clad layer 26, and the second contact layer 27 are removed from a region for forming the semiconductor laser for CD 19 and the interelement separating region. Thereafter, the photoresist 28 is removed. Thereby, as shown in FIG. 4, a semiconductor laser for DVD 29 (second semiconductor laser) interelement-separated from the semiconductor laser for CD 19 is formed. Here, a total film thickness X of the fourth upper clad layer 26 and the second contact layer 27 of the semiconductor laser for DVD 29 is made smaller than a total film thickness Y of the second upper clad layer 16 and the first contact layer 17 of the semiconductor laser for CD 19.

Figure 5:
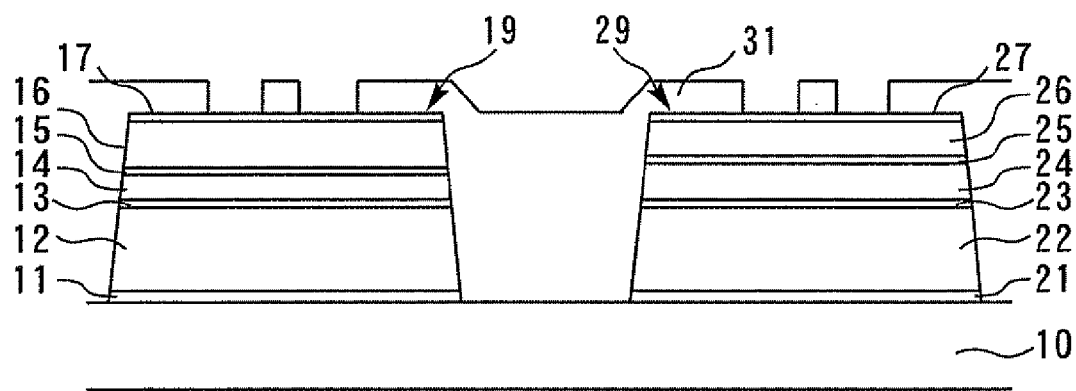
Figure 6:
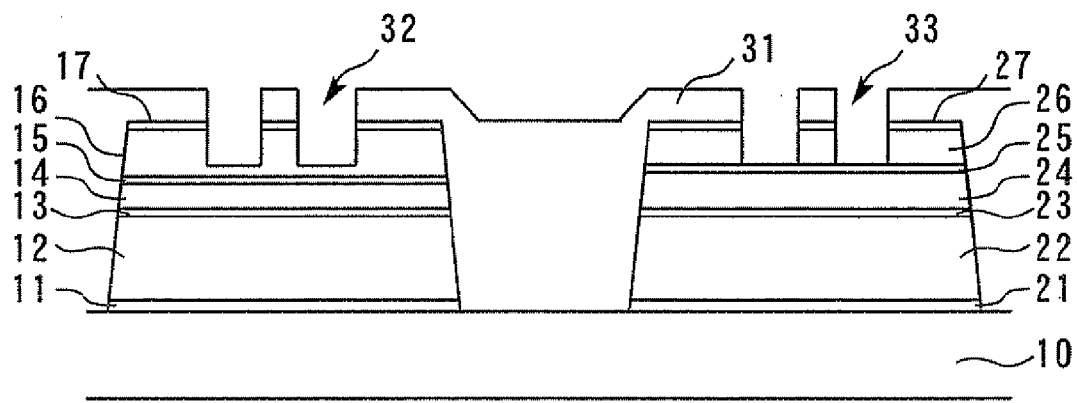

Next, as shown in FIG. 5, a photoresist 31 (resist) is applied onto the entire surface, and the photoresist 31 is patterned to form openings in the semiconductor laser for CD 19 and the semiconductor laser for DVD 29. Then, as shown in FIG. 6, by dry etching using the photoresist 31 as a mask, a first ridge 32 is formed on the first contact layer 17 and the second upper clad layer 16 of the semiconductor laser for CD 19, and a second ridge 33 is simultaneously formed on the second contact layer 27 and the fourth upper clad layer 26 of the semiconductor laser for DVD 29. At this time, light emission from the second etching stopper layer 25 of the semiconductor laser for DVD 29 is detected, and the dry etching is stopped when the second etching stopper layer 25 is exposed on the side of the second ridge 33. Thereby, the second upper clad layer 16 is left on the first etching stopper layer 15 of the semiconductor laser for CD 19 on the bottom of the first ridge 32.

Figure 7:
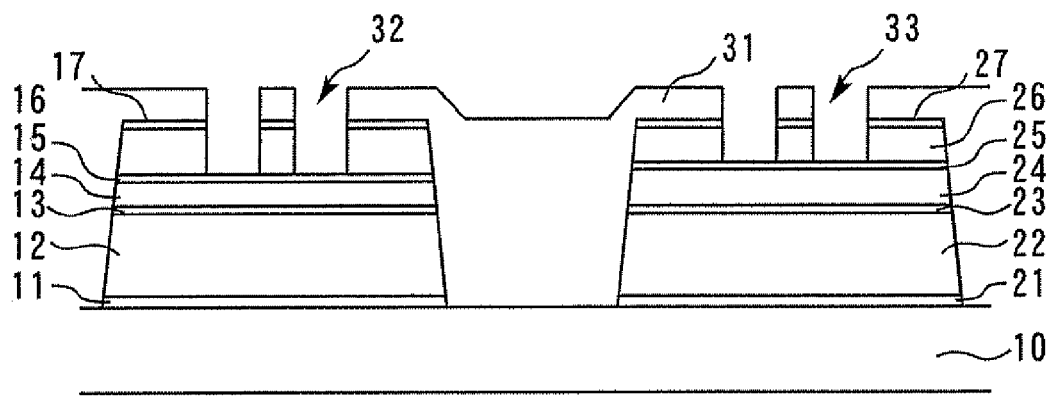
Figure 8:
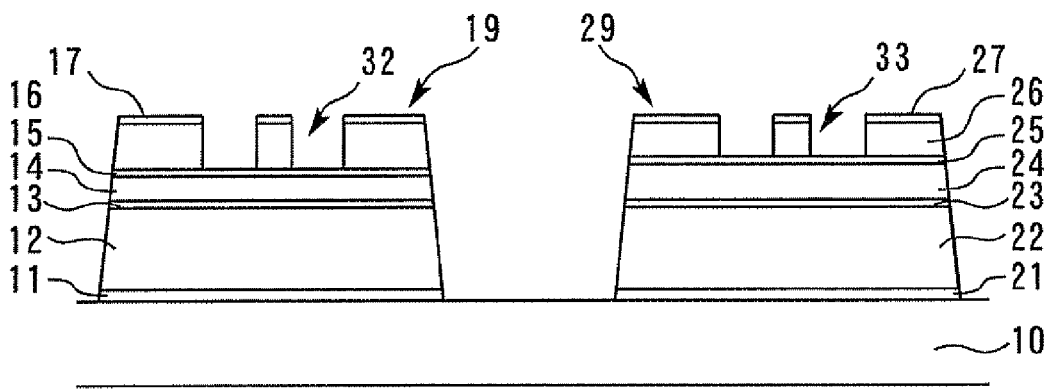

Next, as shown in FIG. 7, by wet etching using tartaric acid or the like using the photoresist 31 as a mask, the second upper clad layer 16 remaining on the first etching stopper layer 15 of the semiconductor laser for CD 19 on the side of the first ridge 32 is selectively removed. Thereafter, the photoresist 31 is removed as shown in FIG. 8.

According to the above-described steps, etching for ridge formation can be stopped by individual etching stopper layers in both semiconductor lasers. Therefore, since the film thicknesses of the epitaxial layers on the active layers can be controlled with a high degree of accuracy, the fluctuation of laser properties can be suppressed, and reliability can be improved.

Second Embodiment

Figure 9:
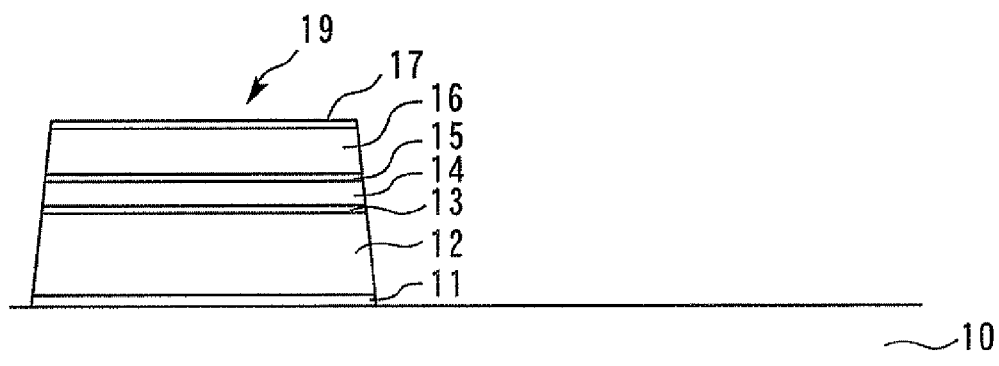
FIGS. 9-14 are sectional views for explaining a method of manufacturing a monolithic semiconductor laser according to Second Embodiment of the present invention.

A method for manufacturing a monolithic semiconductor laser according to the second embodiment of the present invention will be described referring to the drawings. First, as shown in FIG. 9, a buffer layer 11 composed of AlGaAs or GaAs, a first lower clad layer 12 of a multilayer structure composed of AlGaInP or having a lower AlGaInP layer and an upper AlGaAs layer, a first active layer 13 having a multi-quantum well structure composed of AlGaAs or AlGaAs/GaAs, a first upper clad layer 14 composed of AlGaAs, a first etching stopper layer 15, a second upper clad layer 16 composed of AlGaInP, and a first contact layer 17 are sequentially formed on a GaAs substrate 10 (semiconductor substrate). Then, by photolithography and etching, the buffer layer 11, the first lower clad layer 12, the first active layer 13, the first upper clad layer 14, the first etching stopper layer 15, the second upper clad layer 16, and the first contact layer 17 are removed from a region for forming a semiconductor laser for DVD (described later) and an interelement separating region. Thereby, a semiconductor laser for CD 19 (first semiconductor laser) is formed.

Figure 10:
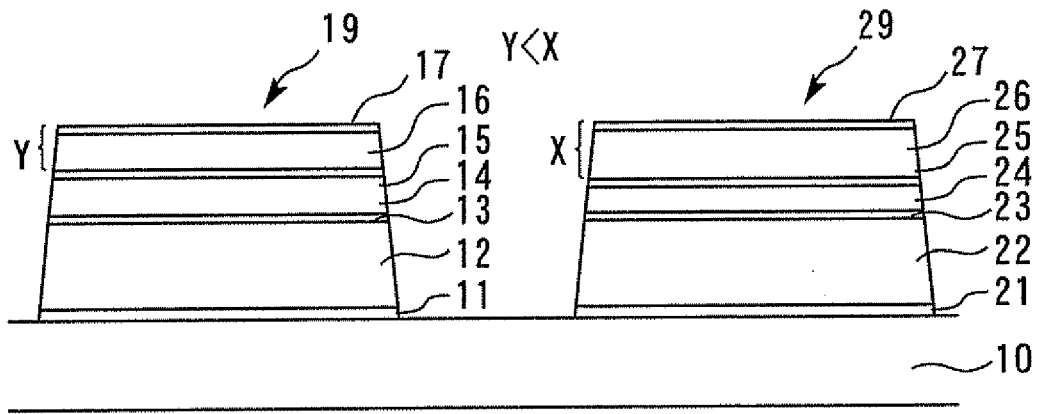

Next, as shown in FIG. 10, a buffer layer 21, a second lower clad layer 22 composed of AlGaInP, a second active layer 23, a third upper clad layer 24 composed of AlGaInP, a second etching stopper layer 25, a fourth upper clad layer 26 composed of AlGaInP, and a second contact layer 27 are sequentially formed on the GaAs substrate 10. Then, by photolithography and etching, the buffer layer 21, the second lower clad layer 22, the second active layer 23, the third upper clad layer 24, the second etching stopper layer 25, the fourth upper clad layer 26, and the second contact layer 27 are removed from a region for forming the semiconductor laser for CD 19 and the interelement separating region. Thereby, a semiconductor laser for DVD 29 (second semiconductor laser) interelement-separated from the semiconductor laser for CD 19 is formed. Here, a total film thickness X of the fourth upper clad layer 26 and the second contact layer 27 of the semiconductor laser for DVD 29 is made larger than a total film thickness Y of the second upper clad layer 16 and the first contact layer 17 of the semiconductor laser for CD 19.

Figure 11:
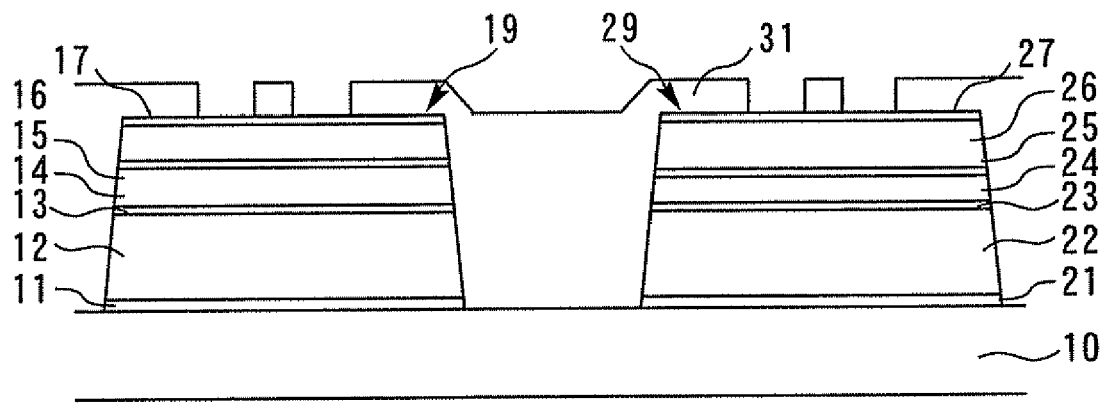
Figure 12:
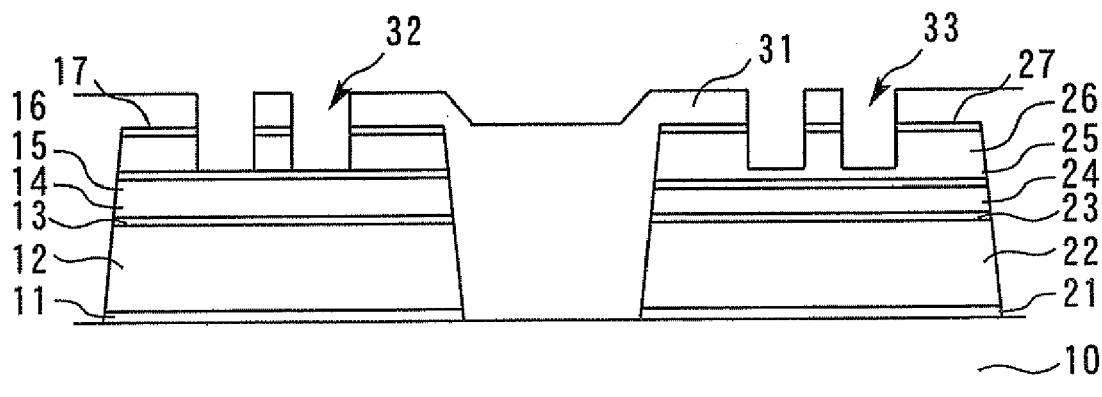

Next, as shown in FIG. 11, a photoresist 31 (resist) is applied onto the entire surface, and the photoresist 31 is patterned to form openings in the semiconductor laser for CD 19 and the semiconductor laser for DVD 29. Then, as shown in FIG. 12, by dry etching using the photoresist 31 as a mask, a first ridge 32 is formed on the first contact layer 17 and the second upper clad layer 16 of the semiconductor laser for CD 19, and the second ridge 33 is simultaneously formed on the second contact layer 27 and the fourth upper clad layer 26 of the semiconductor laser for DVD 29. At this time, light emission from the first etching stopper layer 15 of the semiconductor laser for CD 19 is detected, and the dry etching is stopped when the first etching stopper layer 15 is exposed on the side of the first ridge 32. Thereby, the fourth upper clad layer 26 is left on the second etching stopper layer 25 of the semiconductor laser for DVD 29 on the bottom of the second ridge 33.

Figure 13:
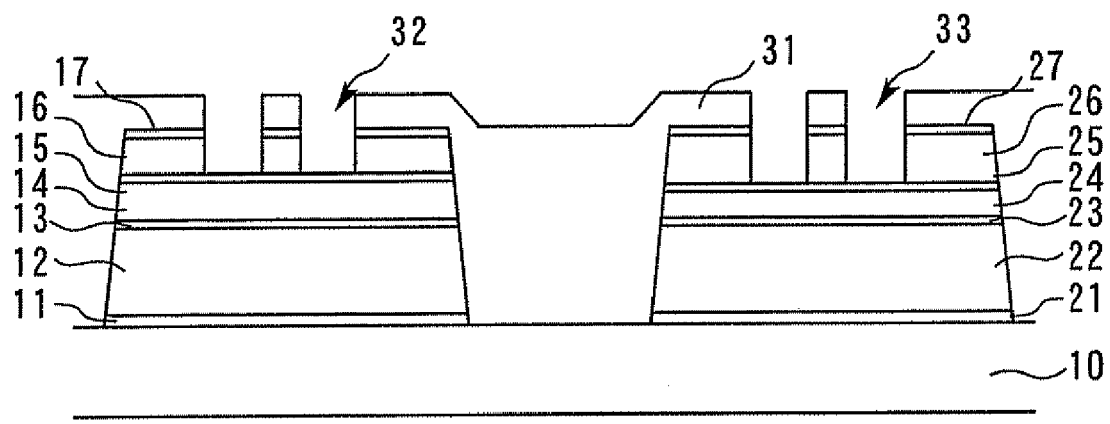
Figure 14:
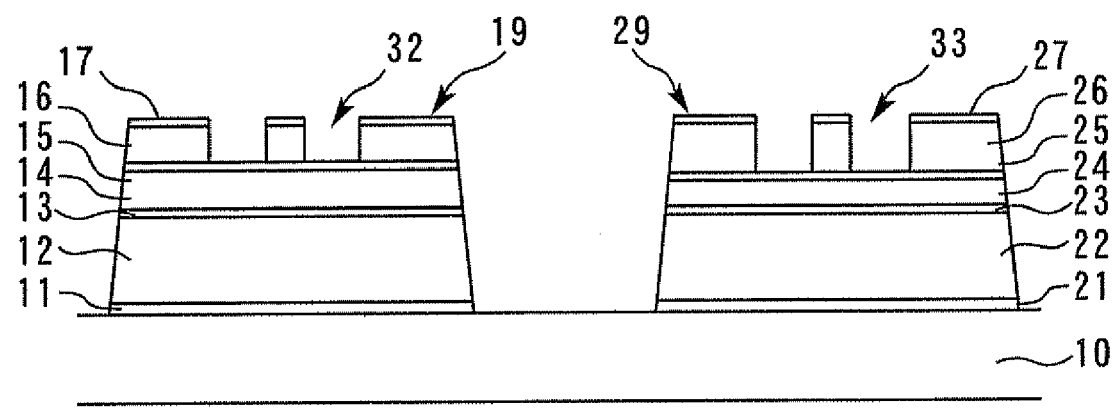

Next, as shown in FIG. 13, by wet etching using sulfuric acid or the like using the photoresist 31 as a mask, the fourth upper clad layer 26 remaining on the second etching stopper layer 25 of the semiconductor laser for DVD 29 on the side of the second ridge 33 is selectively removed. Thereafter, the photoresist 31 is removed as shown in FIG. 14.

According to the above-described steps, etching for ridge formation can be stopped by individual etching stopper layers in both semiconductor lasers. Therefore, since the film thicknesses of the epitaxial layers on the active layers can be controlled with a high degree of accuracy, the fluctuation of laser properties can be suppressed, and reliability can be improved.

Third Embodiment

Figure 15:
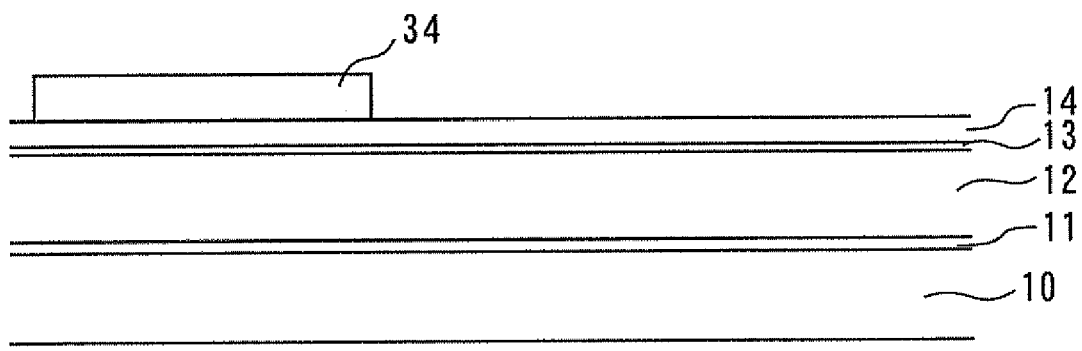
FIGS. 15-23 are sectional views for explaining a method of manufacturing a monolithic semiconductor laser according to Third Embodiment of the present invention.

A method for manufacturing a monolithic semiconductor laser according to the third embodiment of the present invention will be described referring to the drawings. First, as shown in FIG. 15, a buffer layer 11 composed of AlGaAs or GaAs, a first lower clad layer 12 of a multilayer structure composed of AlGaInP or having a lower AlGaInP layer and an upper AlGaAs layer, a first active layer 13 having a multi-quantum well structure composed of AlGaAs or AlGaAs/GaAs, a first upper clad layer 14 composed of AlGaAs are sequentially formed on a GaAs substrate 10 (semiconductor substrate). Thereafter, a photoresist 34 is applied onto the entire surface and patterned.

Figure 16:
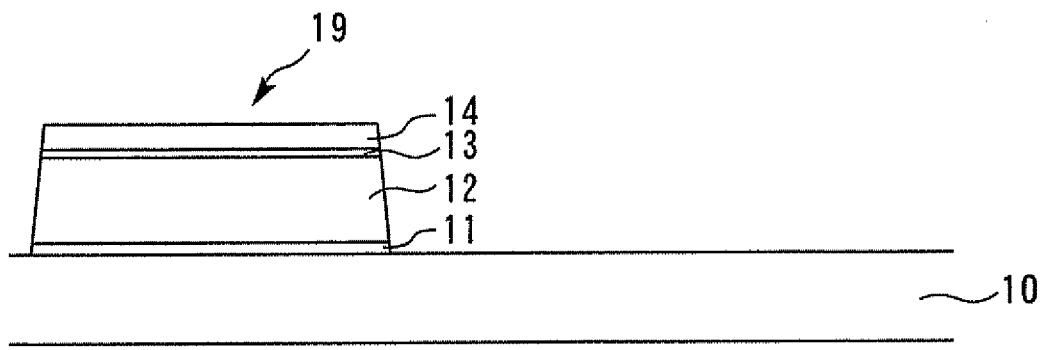

Next, by etching using the photoresist 34 as a mask, the buffer layer 11, the first lower clad layer 12, the first active layer 13, and the first upper clad layer 14 are removed from a region for forming a semiconductor laser for DVD (described later) and an interelement separating region. Thereafter, the photoresist 34 is removed. Thereby, as shown in FIG. 16, a lower portion of a semiconductor laser for CD 19 (first semiconductor laser) is formed.

Figure 17:
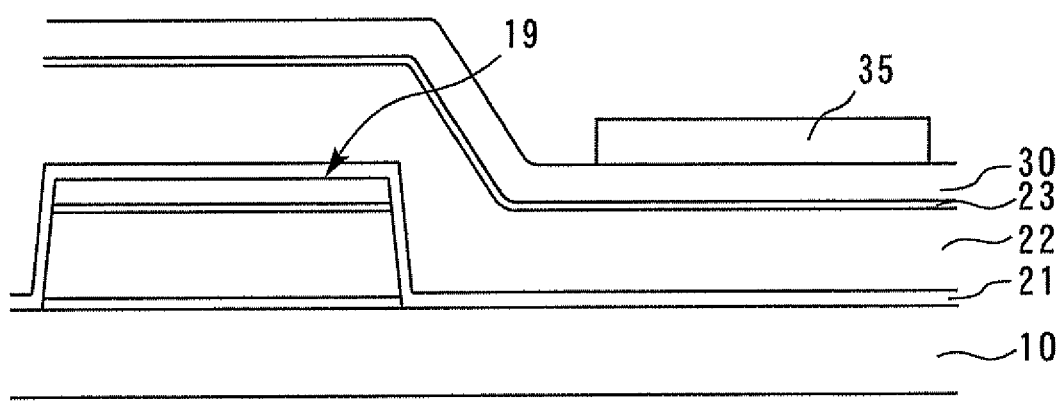

Next, as shown in FIG. 17, a buffer layer 21, a second lower clad layer 22 composed of AlGaInP, a second active layer 23, and a second upper clad layer 30 composed of AlGaInP are sequentially formed on the GaAs substrate 10. Then, a photoresist 35 is applied onto the entire surface and patterned.

Figure 18:
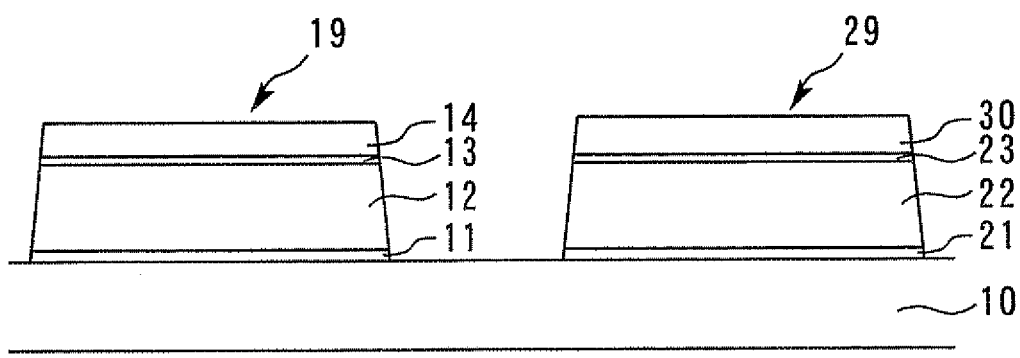

Next, by etching using the photoresist 35 as a mask, the buffer layer 21, the second lower clad layer 22, the second active layer 23, and the second upper clad layer 30 are removed from a region for forming the semiconductor laser for CD 19 and the interelement separating region. Thereafter, the photoresist 35 is removed. Thereby, as shown in FIG. 18, a lower portion of a semiconductor laser for DVD 29 (second semiconductor laser) interelement-separated from the semiconductor laser for CD 19 is formed.

Figure 19:
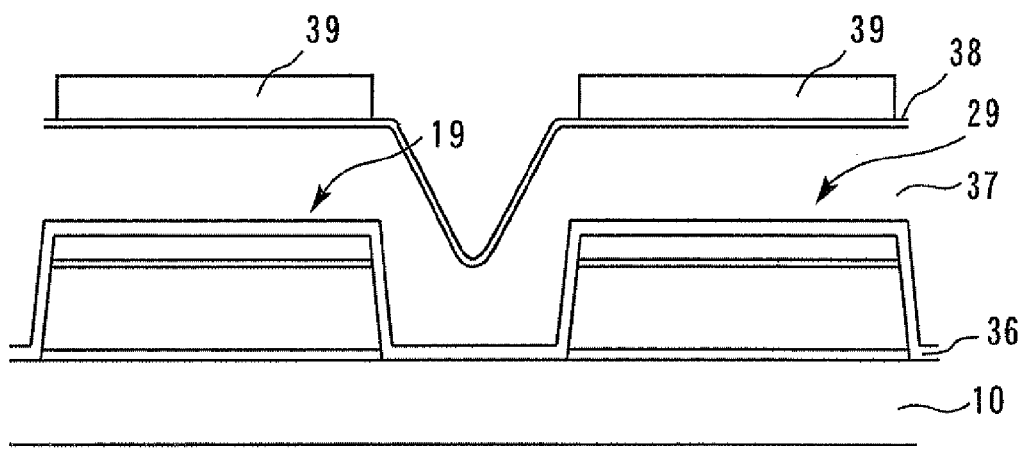

Next, as shown in FIG. 19, an etching stopper layer 36, a third upper clad layer 37, and a contact layer 38 are formed on the entire surface. Then, a photoresist 39 is applied onto the entire surface and patterned.

Figure 20:
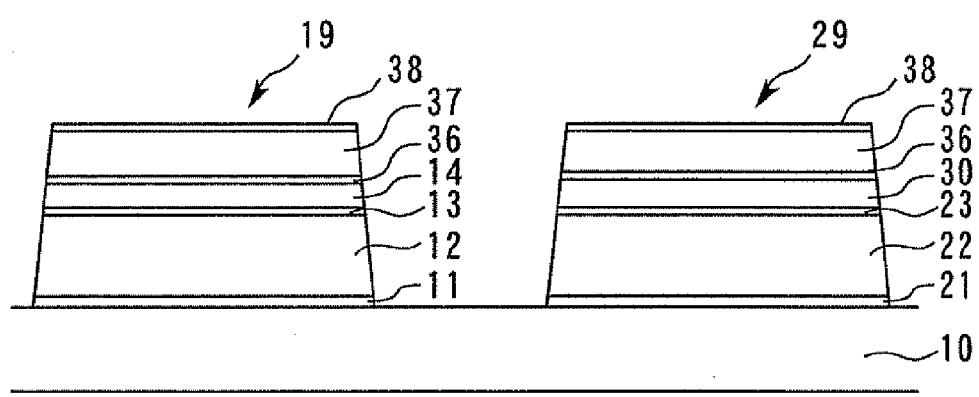

Next, as shown in FIG. 20, by etching using the photoresist 39 as a mask (patterning), the etching stopper layer 36, the third upper clad layer 37, and the contact layer 38 are removed from the interelement separating region to provide the semiconductor laser for CD 19 and the semiconductor laser for DVD 29. Thereafter, the photoresist 39 is removed.

Figure 21:
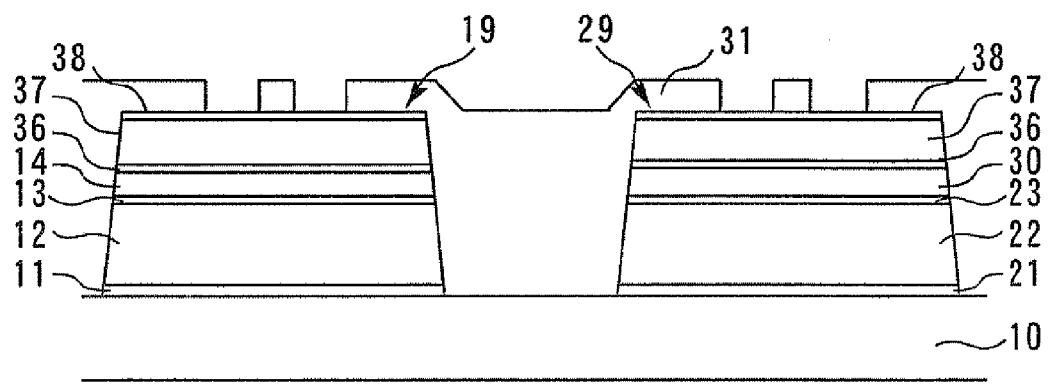
Figure 22:
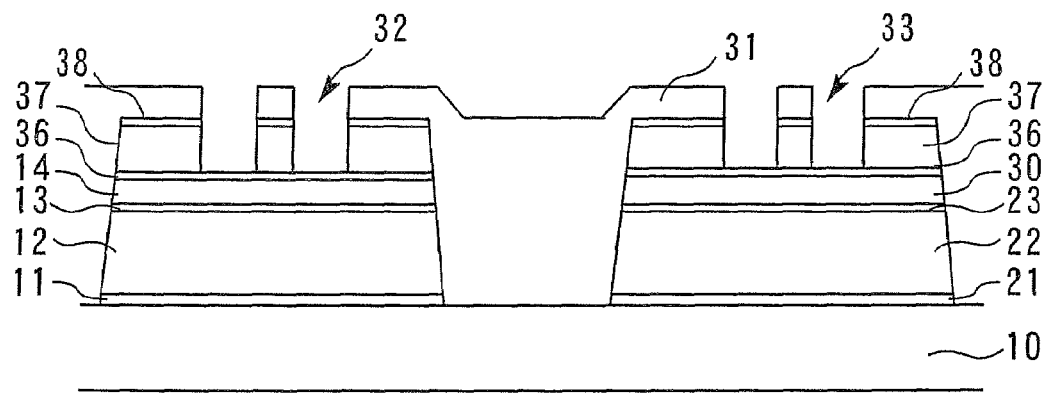
Figure 23:
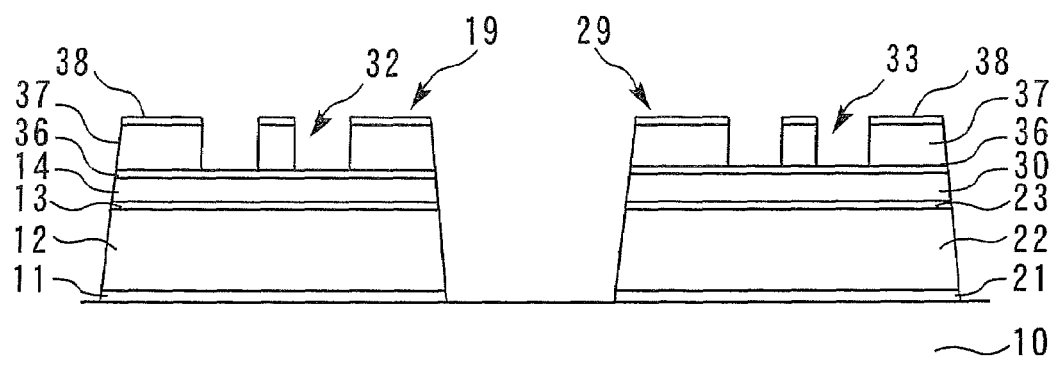
Figure 24:
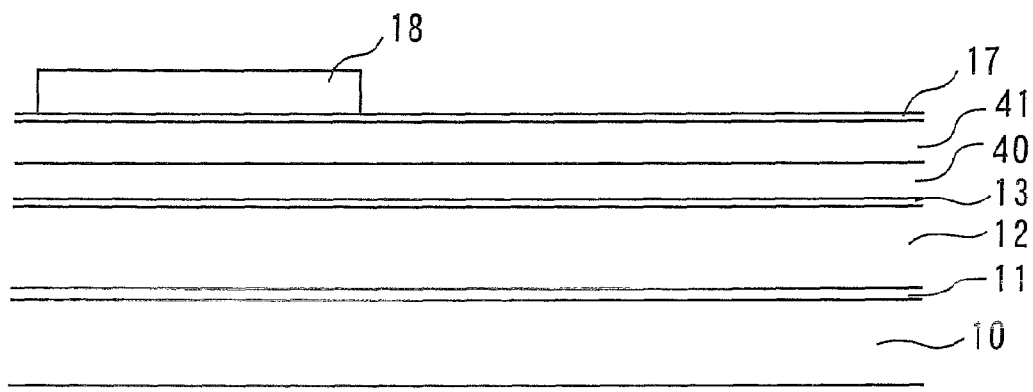
FIGS. 24-29 are sectional views for explaining a method of manufacturing a conventional monolithic semiconductor laser.
Figure 25:
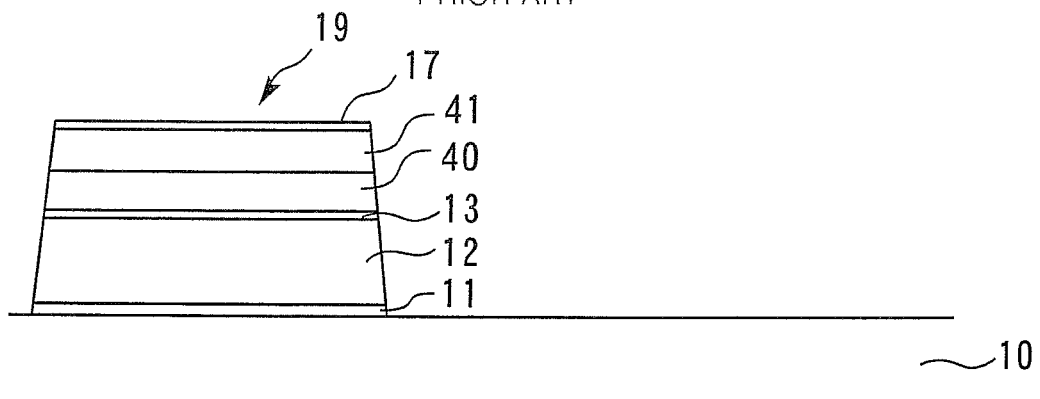
Figure 26:
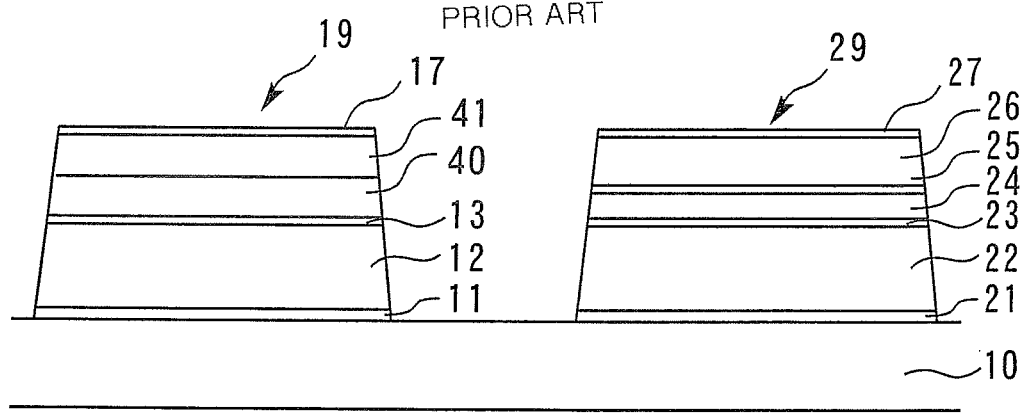
Figure 27:
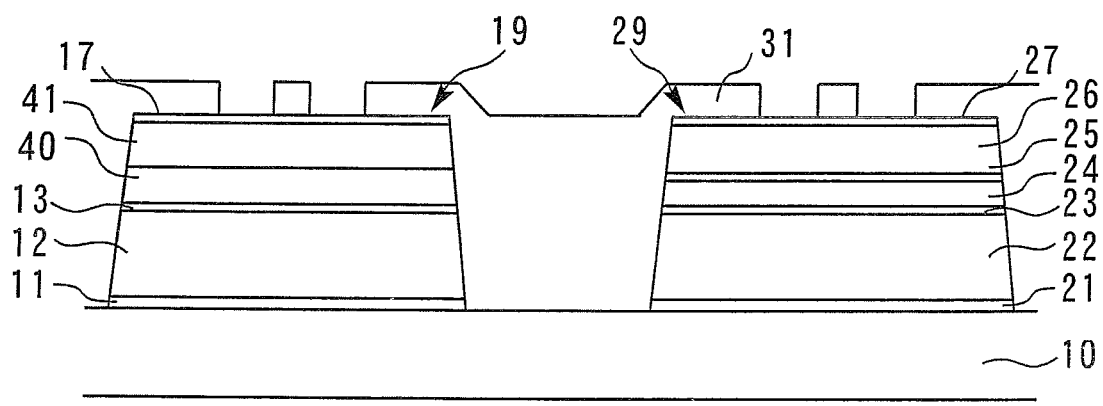
Figure 28:
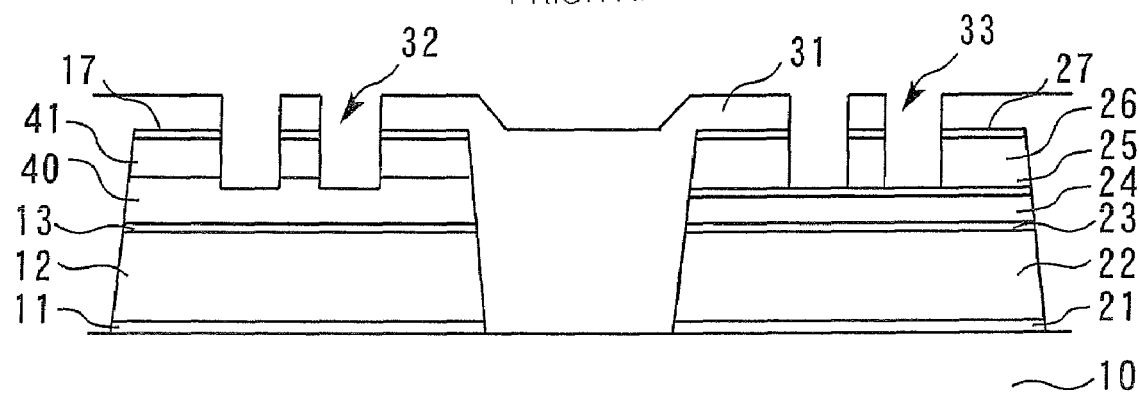
Figure 29:
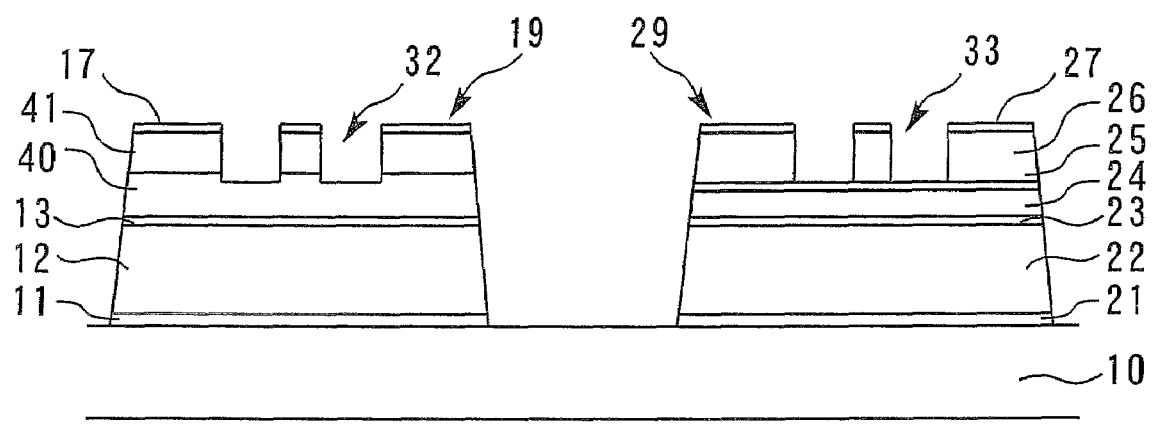

Next, as shown in FIG. 21, a photoresist 31 (resist) is applied onto the entire surface, and the photoresist 31 is patterned to form openings in the semiconductor laser for CD 19 and the semiconductor laser for DVD 29. Then, as shown in FIG. 22, by dry etching using the photoresist 31 as a mask, a first ridge 32 is formed on the contact layer 38 and the third upper clad layer 37 of the semiconductor laser for CD 19, and a second ridge 33 is simultaneously formed on the contact layer 38 and the upper clad layer 37 of the semiconductor laser for DVD 29. Thereafter, the photoresist 31 is removed as shown in FIG. 23.

According to the above-described steps, since the epitaxial layers on the etching stopper layers in both semiconductor lasers have the same thickness, etching for ridge formation can be stopped by individual etching stopper layers in both semiconductor lasers. Therefore, since the film thicknesses of the epitaxial layers on the active layers can be controlled with a high degree of accuracy, the fluctuation of laser properties can be suppressed, and reliability can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-263573, filed on Oct. 9, 2007 including specification, claims, drawings and summary, on which the Convention priority of the present application is based, are incorporated herein by reference in its entirety.

What is claimed is:

1. A method for manufacturing a monolithic semiconductor laser device including first and second semiconductor lasers, the method comprising:

forming a first lower cladding layer, a first active layer, a first upper cladding layer, a first etching stopper layer, a second upper cladding layer, and a first contact layer of said first semiconductor laser, on a semiconductor substrate;

forming a second lower cladding layer, a second active layer, a third upper cladding layer, a second etching stopper layer, a fourth upper cladding layer, and a second contact layer of said second semiconductor laser interelement-separated from said first semiconductor laser, on said semiconductor substrate so that total thickness of said fourth upper cladding layer and said second contact layer is smaller than total thickness of said second upper cladding layer and said first contact layer;

applying a resist covering all of said first and second contact layers and patterning said resist to form openings at said first and second semiconductor lasers;

simultaneously forming first and second ridges of parts of said second upper cladding layer and said first contact layer, and parts of said fourth upper cladding layer and said second contact layer, respectively, by dry etching, using said resist as a mask, and stopping the dry etching when said second etching stopper layer is exposed at said second ridge by the dry etching; and selectively removing said second upper cladding layer remaining on said first etching stopper layer at said first ridge, by wet etching, using said resist as a mask.

2. A method for manufacturing a monolithic semiconductor laser device including first and second semiconductor lasers, the method comprising:

forming a first lower cladding layer, a first active layer, a first upper cladding layer, a first etching stopper layer, a second upper cladding layer, and a first contact layer of said first semiconductor laser, on a semiconductor substrate;

forming a second lower cladding layer, a second active layer, a third upper cladding layer, a second etching stopper layer, a fourth upper cladding layer, and a second contact layer of said second semiconductor laser interelement-separated from said first semiconductor laser, on said semiconductor substrate so that total thickness of said fourth upper cladding layer and said second contact layer is larger than total thickness of said second upper cladding layer and said first contact layer;

applying a resist covering all of said first and second contact layers and patterning said resist to form openings at said first and second semiconductor lasers;

simultaneously forming first and second ridges of parts of said second upper cladding layer and said first contact layer, and parts of said fourth upper cladding layer and said second contact layer, respectively, by dry etching, using said resist as a mask, and stopping the dry etching when said first etching stopper layer is exposed at said first ridge by the dry etching; and selectively removing said fourth upper cladding layer remaining on said second etching stopper layer at said second ridge, by wet etching, using said resist as a mask.

* * * * *